(12) United States Patent
Kim et al.

(10) Patent No.: US 8,378,749 B1
(45) Date of Patent: Feb. 19, 2013

(54) SYSTEMS AND METHODS FOR ADAPTIVE BIAS CIRCUITS FOR A POWER AMPLIFIER

(75) Inventors: Woonyun Kim, Johns Creek, GA (US); Jeonghu Han, Atlanta, GA (US); Ki Seok Yang, Atlanta, GA (US); Jae Joon Chang, Duluth, GA (US); Chang-Ho Lee, Marietta, GA (US)

(73) Assignee: Samsung Electro-Mechanics, Gyunngi-Do (KR)

( * ) Notice: Subject to any disclaimer, the term of this patent is extended or adjusted under 35 U.S.C. 154(b) by 20 days.

(21) Appl. No.: 13/194,270

(22) Filed: Jul. 29, 2011

(51) Int. Cl.
  *H03F 3/45* (2006.01)
(52) U.S. Cl. ........................................ 330/261; 330/285
(58) Field of Classification Search .................. 330/261, 330/285, 296, 136
  See application file for complete search history.

(56) References Cited

U.S. PATENT DOCUMENTS

| 4,074,205 A | * | 2/1978 | Robe | 330/257 |
| 5,343,164 A | * | 8/1994 | Holmdahl | 330/253 |
| 7,425,867 B2 | * | 9/2008 | Aemireddy et al. | 330/257 |

* cited by examiner

*Primary Examiner* — Henry Choe

(57) ABSTRACT

Systems and methods may include an amplifier having at least a first input port, where the amplifier includes a first capacitance associated with the first input port; a first bias circuit, where the first bias circuit comprises a series connection of a first charging circuit and a first discharging circuit, wherein a first node between the first charging circuit and the first discharging circuit is connected to the first input port, wherein responsive to an RF input signal having at least a first predetermined level being received at the first input port, the first charging circuit charges the first capacitance associated with the first input port during a first portion of a cycle of the RF input signal, and discharges the first capacitance associated with the first input port during a second portion of the cycle, thereby controlling a DC bias voltage level available at the first input port.

20 Claims, 11 Drawing Sheets

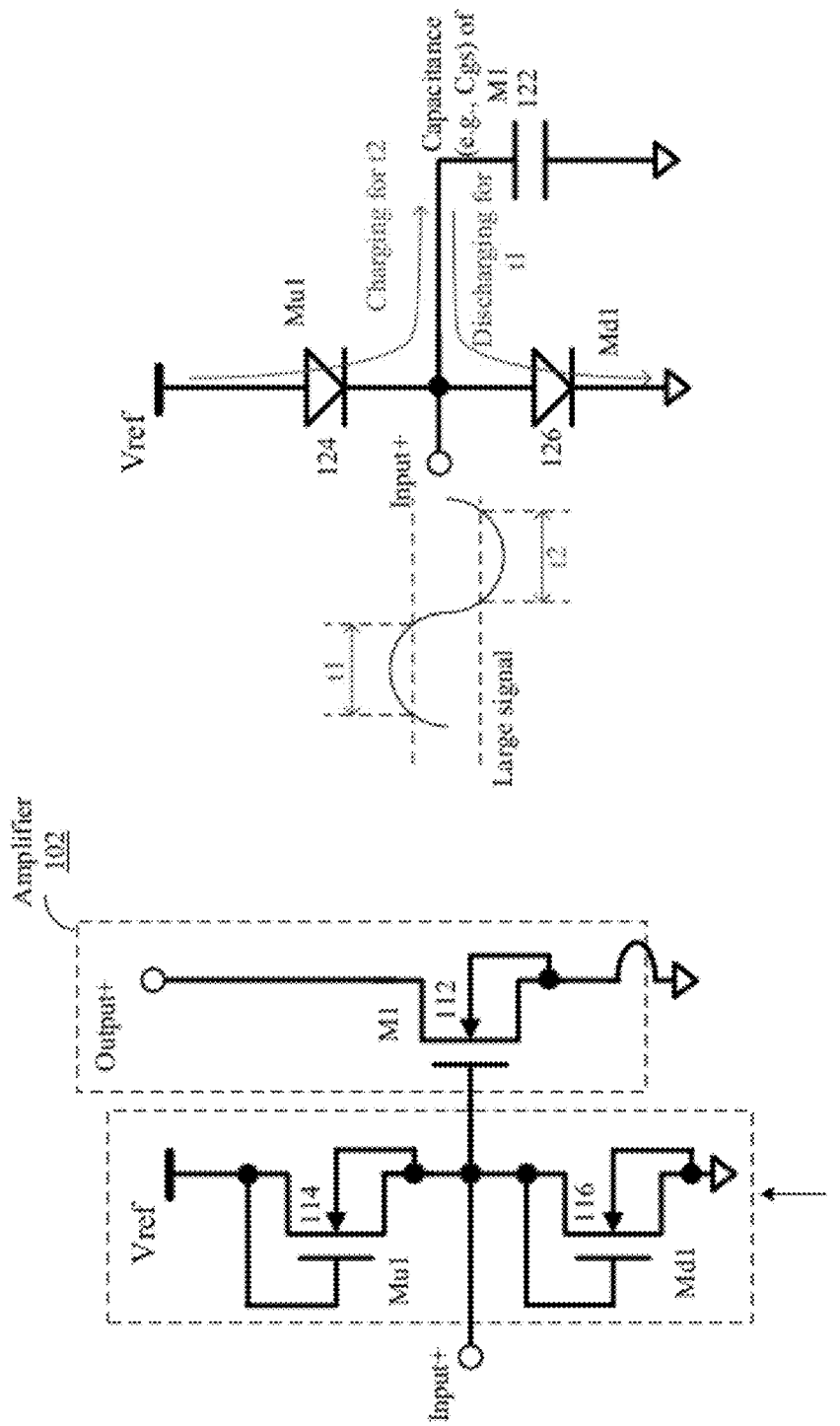

SYSTEMS AND METHODS FOR ADAPTIVE BIAS CIRCUITS FOR A POWER AMPLIFIER

FIELD OF THE INVENTION

Embodiments of the invention relate generally to power amplifier system control, and more specifically to systems and methods for adaptive biasing of power amplifiers based upon input signal levels.

BACKGROUND OF THE INVENTION

With the ever-growing needs for wireless communications, more efforts have been made to provide a fully integrated radio frequency (RF) transceiver, which would result in lower bill of materials, a smaller form factor, and more functionality. A complementary metal oxide semiconductor (CMOS) power amplifier (PA) may be a good candidate to achieve one or more of the foregoing goals, and a higher level of transceiver integration that includes a PA has recently been demonstrated for some wireless communications such as wireless LAN, Bluetooth, and Cordless phone. However, CMOS PAs need to utilize various techniques such as a distributed active-transformer, Doherty, parallel power combining, and polar transmission to compete with HBT PAs, because the power capability of CMOS transistors is much less than that of hetero junction bipolar transistor (HBT) PAs. With continuous research to improve power and efficiency, switching CMOS PAs have attracted attention for their high power-added efficiency (PAE), but at the sacrifice of linearity. For a linear CMOS PA, however, good linearity and good efficiency cannot be easily achieved at the same time. Since recent wireless systems require a high peak-to-average ratio (PAPR) to increase data rates, linear PAs should operate at a power back-off of a PAPR from 1 dB power compression point ($P_{1dB}$), which results in a heavy loss of PAE.

BRIEF SUMMARY OF THE INVENTION

In accordance with example embodiments of the invention, linear power amplifiers (PAs) with adaptive bias circuits may be utilized for various radio frequency (RF) applications. The adaptive bias circuits may adaptively boost up bias voltages with large input signals to increase the 1 dB compression point ($P_{1dB}$) (or alternatively another compression point as desired) to be close to peak power. It will be appreciated that the utilization of the example adaptive bias circuits may minimize amplitude-to-amplitude (AM-AM) nonlinearity and power back-off from the peak, thus increasing the average output power ($P_{out}$) and the efficiency, according to an example embodiment of the invention.

According to an example embodiment of the invention, there may be a power amplifier system. The power amplifier system may include one or more amplifier stages, which may be operative to receive an input signal for each stage and generate an amplified input signal as an output signal, and at least one bias circuit for the one or more amplifier stages. An example bias circuit may comprise at least a charging circuit and a discharging circuit that are connected in series. The charging circuit may also be connected to a first reference voltage and the discharging circuit can also be connected to a second reference voltage such as ground. A node between the charging circuit and the discharging circuit can be connected to the input of an amplifier, so that the bias circuit can provide a DC bias voltage at the input of the amplifier. Since the bias circuit is connected to an input of the amplifier, it may be responsive to the RF input signal levels. Accordingly, the bias circuit can adaptively provide DC bias voltages that are based at least in part on the level of the received RF input signal. When the RF input signal is small (e.g., below a first predetermined level that cannot turn on or off the charging circuit/discharging circuit) or not applied, the DC bias provided by the bias circuit can be determined by the size (e.g., associated impedance in various states such as ON-state, OFF-state, intermediate states, etc.) of the charging circuit and discharging circuit. On the other hand, when the RF input signal level is above another predetermined level, it may be sufficient to turn off and on the charging circuit and discharging circuit for at least a portion of a cycle of the RF input signal swing. As such, the adaptive bias circuit may operate similarly as a charge pump. For example, during a first portion of a cycle of the RF input signal swing, the charging circuit can allow a charge current to flow from the first reference voltage to the input of the amplifier in order to charge an associated capacitance of the amplifier (e.g., a gate-to-source capacitance for a MOSFET, a base-to-emitter capacitance for a BJT, or other parasitic capacitance available at the input of the amplifier). On the other hand, during a second portion of the cycle of the RF input signal swing, the discharging circuit can allow for discharge current to flow from the input of the amplifier to a second reference voltage (e.g., ground) in order to discharge the associated capacitance of the amplifier (e.g., a gate-to-source capacitance for a MOSFET, a base-to-emitter capacitance for a BJT, or other parasitic capacitance available at the input of the amplifier). If the charging circuit is of a larger size than the discharging circuit, then more charging current will be provided compared to discharging current, and the DC level at the input of the amplifier can increase as the RF input signal level increases. On the other hand, if the charging circuit is smaller than the discharging circuit, then less charging current will be provided compared to discharging current, and the DC level at the input of the amplifier can decrease as the RF input signal level increases. Accordingly, by properly optimizing the size of the charging and discharging circuits as well as the reference voltages, the DC bias voltage level provided at the input of the amplifier can be controlled. For example, the DC bias voltage level can be substantially constant at no or small RF input signal levels, and increase as the RF input signal level increases beyond a predetermined signal level.

According to an example embodiment of the invention, there is an amplifier system. The amplifier system may include an amplifier having at least a first input port, wherein the amplifier includes a first capacitance associated with the first input port; a first bias circuit, wherein the first bias circuit comprises a series connection of a first charging circuit and a first discharging circuit, wherein a first node between the first charging circuit and the first discharging circuit is connected to the first input port of the amplifier, wherein responsive to a radio frequency (RF) input signal having at least a first predetermined level being received at the first input port, the first charging circuit charges the first capacitance associated with the first input port during a first portion of a cycle of the RF input signal, and discharges the first capacitance associated with the first input port during a second portion of the cycle of the RF input signal, thereby controlling a DC bias voltage level available at the first input port of the amplifier.

According to another example embodiment, there is a method. The method may include providing an amplifier having at least a first input port, wherein the amplifier includes a first capacitance associated with the first input port; providing a first bias circuit, wherein the first bias circuit comprises a series connection of a first charging circuit and a first discharging circuit, wherein a first node between the first charging circuit and the first discharging circuit is connected to the first input port of the amplifier; and responsive to a radio frequency (RF) input signal having at least a first predetermined level being received at the first input port: charging, by the first charging circuit, the first capacitance associated with the first input port during a first portion of a cycle of the RF input signal, and discharging, by the first discharging circuit, the first capacitance associated with the first input port during a second portion of the cycle of the RF input signal, thereby controlling a DC bias voltage level available at the first input port of the amplifier.

BRIEF DESCRIPTION OF THE DRAWINGS

FIG. 1B illustrates an example implementation of an amplifier and adaptive bias circuit, according to an example embodiment of the invention.

FIG. 1C illustrates a circuit diagram that models the example amplifier and adaptive bias circuit of FIG. 1B, according to an example embodiment of the invention.

DETAILED DESCRIPTION OF THE INVENTION

Figure 1A:
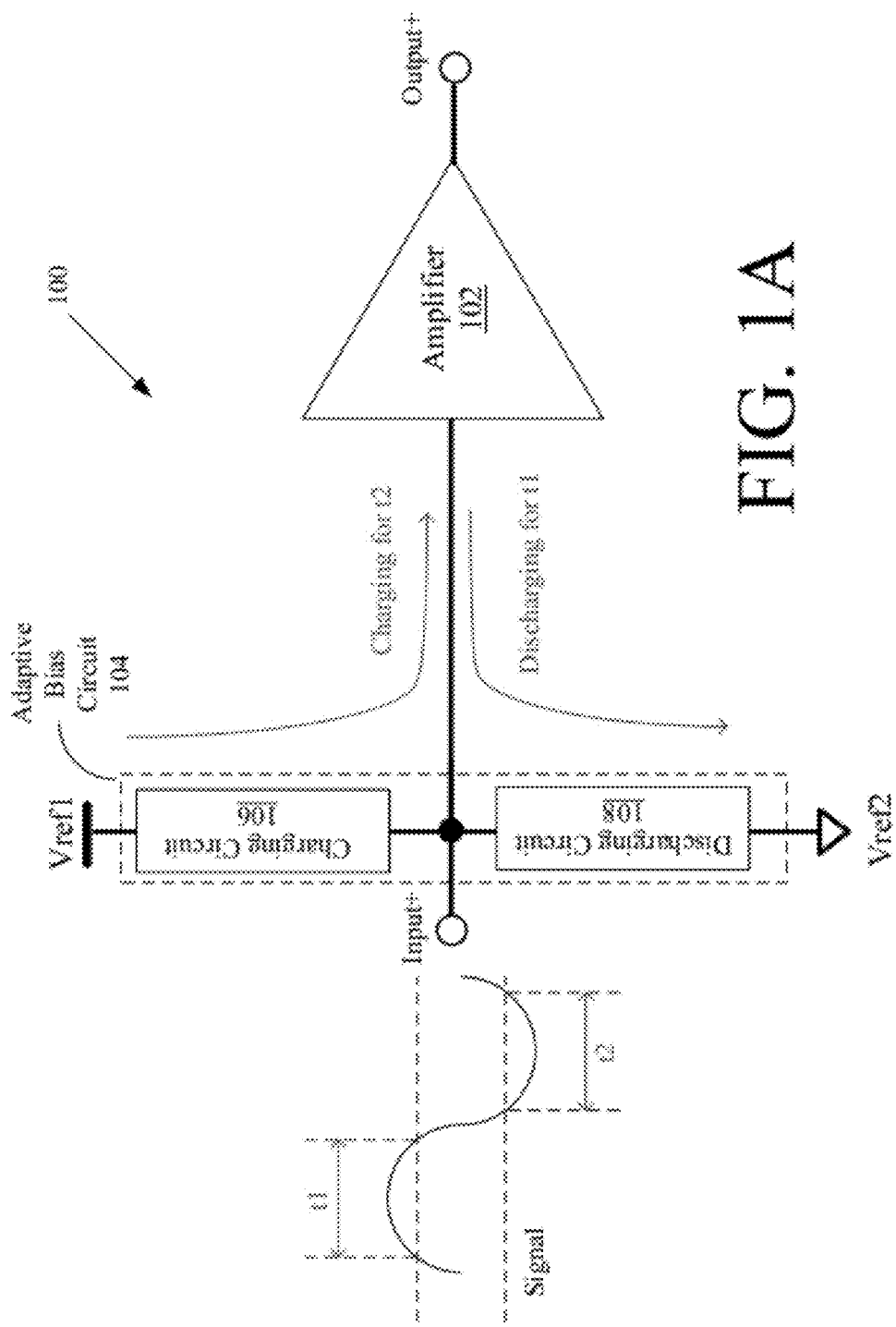
FIG. 1A illustrates an example CMOS amplifier system that includes at least an amplifier and an adaptive bias circuit, according to an example embodiment of the invention.

Example embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

According to an example embodiment of the invention, there may be a power amplifier system. The power amplifier system may include one or more amplifier stages, which may be operative to receive an input signal for each stage and generate an amplified input signal as an output signal, and at least one bias circuit for the one or more amplifier stages. An example bias circuit may comprise at least a charging circuit and a discharging circuit that are connected in series. The charging circuit may also be connected to a first reference voltage and the discharging circuit can also be connected to a second reference voltage such as ground. A node between the charging circuit and the discharging circuit can be connected to the input of an amplifier, so that the bias circuit can provide a DC bias voltage at the input of the amplifier. Since the bias circuit is connected to an input of the amplifier, it may be responsive to the RF input signal levels. Accordingly, the bias circuit can adaptively provide DC bias voltages that are based at least in part on the level of the received RF input signal. When the RF input signal is small (e.g., below a predetermined level that cannot turn on or off the charging circuit/discharging circuit) or not applied, the DC bias provided by the bias circuit can be determined by the size (e.g., associated impedance or current throughput in various states such as ON-state, OFF-state, intermediate states, etc.) of the charging circuit and discharging circuit. On the other hand, when the RF input signal level is above a predetermined level, it may be sufficient to turn off and on the charging circuit and discharging circuit for at least a portion of a cycle of the RF input signal swing. As such, the adaptive bias circuit may operate similarly as a charge pump. For example, during a first portion of a cycle of the RF input signal swing, the charging circuit can allow a charge current to flow from the first reference voltage to the input of the amplifier in order to charge an associated capacitance of the amplifier (e.g., a gate-to-source capacitance for a MOSFET, a base-to-emitter capacitance for a BJT, or another parasitic capacitance at the input of the amplifier). On the other hand, during a second portion of the cycle of the RF input signal swing, the discharging circuit can allow for discharge current to flow from the input of the amplifier to a second reference voltage (e.g., ground) in order to discharge the associated capacitance of the amplifier (e.g., a gate-to-source capacitance for a MOSFET, a base-to-emitter capacitance for a BJT, or another parasitic capacitance available at the input of the amplifier). If the charging circuit is of a larger size than the discharging circuit, then more charging current will be provided compared to the discharging current, and the DC level at the input of the amplifier can increase as the RF input signal level increases. On the other hand, if the charging circuit is smaller than the discharging circuit, then less charging current will be provided compared to the discharging current, and the DC level at the input of the amplifier can decrease as the RF input signal level increases. Accordingly, by properly optimizing the size of the charging and discharging circuits as well as the reference voltages, the DC bias voltage level provided at the input of the amplifier can be controlled. For example, the DC bias voltage level can be substantially constant at no or small RF input signal levels, and can increase as the RF input signal level increases beyond a predetermined signal level.

It will be appreciated that the charging and discharging circuits for an adaptive bias circuit can be implemented using a variety of devices. For example, the charging and discharging circuits can have one or more diodes, diode-connected transistors, switches, transmission gates, or the like. If transistors are utilized, they may be one or more bipolar junction transistors (BJTs), heterojunction bipolar transistors (HBTs), high electron mobility transistors (HEMTs), or field effect transistors such as metal-oxide-semiconductor (MOS) field effect transistors (FETs) (MOSFETs or MOS transistors), junction gate FETs (JFETs), or metal semiconductor field effect transistors (MESFETs), according to an example embodiment of the invention.

FIG. 1A illustrates an example CMOS amplifier system 100 that includes at least an amplifier 102 and an adaptive bias circuit 104, according to an example embodiment of the invention. More specifically, the adaptive bias circuit 104 can include a charging circuit 106 and a discharging circuit 108. The charging circuit 106 may be connected to a first reference voltage (Vref1), while the discharging circuit may be connected to a second reference voltage (Vref2), which may be ground in some example embodiments of the invention. A node between the charging circuit 106 and the discharging circuit 108 may be coupled to the input of the amplifier 102.

The amplifier can be virtually any type of amplifier, including a driver amplifier, a power amplifier, and the like. The amplifier can comprise a single stage or a plurality of stages without departing from example embodiments of the invention. For example, an example stage can be in a common source configuration or a cascode configuration, and may be a single input, a single output amplifier or a differential amplifier. Depending upon the type of amplifier 102, the input to the power amplifier 102 can be a gate of a MOSFET or a base of a BJT, according to an example embodiment of the invention.

Because the adaptive bias circuit 104 may be connected directly to the input (e.g., input+) that is received by the amplifier 102, the adaptive bias circuit 104 may be responsive to the level of the RF input signal. As such, when large RF input signals are received at the input, the adaptive bias circuit 104 can operate to boost the DC bias voltage (or alternatively, provide a negative DC bias voltage) applied to the input of the amplifier 102. By boosting the DC bias voltage, the amplifier 102 may be supplied enough DC bias voltage to amplify the RF input signal without gain compression. It will be appreciated that the use of the adaptive bias circuit 104 can minimize amplitude-to-amplitude (AM-AM) nonlinearity and power back-off from the peak (e.g., at $P_{1dB}$), thereby increasing the average output power and efficiency of the amplifier 102, according to an example embodiment of the invention.

The adaptive bias circuit 104 can control the DC bias voltage provided at the input (e.g., input+). When no or small RF input signal levels are received (e.g., RF input signal levels not sufficient to turn off or on the charging circuit 106 or discharging circuit 108), the magnitude of the DC bias voltage at the input (e.g., input+) may generally be determined according to a comparison of the impedance $Z_2$ of the discharging circuit 108 to the impedance $Z_1$ of charging circuit 106. In one example embodiment, the magnitude of the DC bias voltage may be determined as $$(Vref1 - Vref2) * \frac{Z_2}{Z_2 + Z_1}.$$

If Vref2 is ground or 0V, then the DC bias voltage may be Vref1

$$\frac{Z_2}{Z_2 + Z_1}.$$

Accordingly, the magnitude of the DC bias voltage at no or small input signal levels can be determined by selecting the appropriate reference voltages and/or impedance values provided by the charging circuit 106 and the discharging circuit 108. It will be appreciated that when no or small RF input signal levels are received at the input (e.g., input+), the charging circuit 106 and/or the discharging circuit 108 may not perform any significant charging or discharging, as described herein. In this case, the impedances of the charging circuit 106 and discharging circuit 108 may be substantially near the off-state impedance in order to prevent any substantial charging or discharging current to flow through the charging circuit 106 or discharging circuit 108.

It will be appreciated that at no or small RF signal levels, the DC level of the input can be determined by simulating the adaptive bias circuit itself for a specific Vref2 or by using the above-identified equation. For the high RF input power range, the charging current can be found by simulating the whole adaptive circuit with the RF input signal. If the input signal level is small enough to turn off the diode for some moment, and if it even cannot fully turn on for any moment, that is, a t1 duration does not exist, the discharging current may be larger than the level of current at a no signal because the device used in the discharging circuit 108 (or charging circuit 106) such as a diode or resistor has a continuous V-I characteristic. When the signal level is enough large to turn the diode for some moment: t1 is non-zero, the discharging circuit 108 (or charging circuit 106) flows dominantly much larger charging circuit 106 (or discharging charging 108) current through the diode than it does when t1 is zero. The diode's I-V characteristic may be as follows: Id=Is (exp(Vd/nVth)−1) where Id, Is, Vd, Vth, and n are the diode current, the reverse bias saturation current, the voltage across the diode, the thermal voltage, and the ideality factor, respectively, according to an example embodiment of the invention.

On the other hand, when large enough RF input signal levels are received at the input, the adaptive bias circuit 104 can operate to boost the DC bias voltage (or alternatively, provide a negative DC bias voltage) by turning ON or OFF the charging circuit 106 and the discharging circuit 108, which are both responsive to the level of the RF input signal. For example, the charging circuit 106 can operate during time t2 to charge one or more capacitances associated with the input of the amplifier 102 during a first portion (e.g., the lower half cycle or a portion thereof) of the large RF input signal. More specifically, the charging circuit 106, responsive to the level of the RF input signal, can control the extent to which current from the first reference voltage (Vref1) is permitted to flow to the input of the amplifier 102 to charge one or more capacitances associated with the input of the amplifier 102. One the other hand, the discharging circuit 108 can operate during time t1 to discharge one or more capacitances during a second portion (e.g., the upper half cycle or a portion thereof) of the large RF input signal. More specifically, the discharging circuit 108, responsive to the level of the RF input signal, can control the extent to which current is permitted to flow from the input of the amplifier 102 to the second reference voltage (Vref2), which may be ground, in order to discharge one or more capacitances associated with the amplifier 102. By balancing the extent to which one or more capacitances associated with the input of the amplifier 102 are charged or discharged, the DC bias voltage at the input of the amplifier 102 can be increased or decreased as desired responsive to the RF input signal level, according to an example embodiment of the invention.

For a cycle of the RF input signal, if the charging circuit 106 charges the one or more capacitances of the amplifier 102 to a greater extent than the discharging circuit 108 discharges the one or more capacitances, then the overall DC bias voltage at the input of the amplifier 102 may be increased or boosted. On the other hand, for a cycle of the RF input signal, if the discharging circuit 108 discharges the one or more capacitances of the amplifier 102 to a greater extent than the charging circuit 106 charges the one or more capacitances, then the overall DC bias voltage at the input of the amplifier 102 may be reduced or become a negative DC bias voltage.

It will be appreciated that the charging circuit 106 and discharging circuit 108 can be embodied using a variety of components, according to an example embodiment of the invention. For example, each of the circuits 106, 108 can be implemented using one or more diodes, diode-connected transistors, switches, transmission gates, or other devices that can control the extent to which current is allowed to pass through the circuits 106, 108. If transistors are utilized, they may be one or more bipolar junction transistors (BJTs), heterojunction bipolar transistors (HBTs), high electron mobility transistors (HEMTs), or field effect transistors such as metal-oxide-semiconductor (MOS) field effect transistors (FETs) (MOSFETs or MOS transistors), junction gate FETs (JFETs), or metal semiconductor field effect transistor (MES-FETs), according to an example embodiment of the invention. In addition, one or more resistors may further be provided in one or both of circuits 106, 108 to provide a desired impedance for one or both of circuits 106, 108.

FIG. 1B illustrates an example implementation of an amplifier 102 and adaptive bias circuit 104, according to an example embodiment of the invention. In FIG. 1B, the amplifier 102 may be a single-stage amplifier that includes an n-channel metal-oxide-semiconductor (NMOS) transistor 112. The NMOS transistor 112 may have a source connected to a reference voltage such as ground. The gate of the NMOS transistor 112 may be the input that is connected to the adaptive bias circuit 104, and where the RF input signal is received. The drain of the NMOS transistor 112 may provide the output (e.g., output+) of the amplifier 102.

The adaptive bias circuit 104 may include NMOS transistors 114 (Mu1) and 116 (Md1). The NMOS transistor 114 may serve as the charging circuit described herein. The NMOS transistor 114 may be configured as a diode-connected transistor by connecting together its gate and drain. On the other hand, the NMOS transistor 116 may serve as the discharging circuit described herein. The NMOS transistor 16 may be configured as a diode-connected transistor by connecting together its gate and drain. The drain of the NMOS transistor 114 may be connected to a reference voltage (Vref), while the source of the NMOS transistor 116 may be connected to another reference voltage, which may be ground. The source of the NMOS transistor 114 can be connected to the drain of the NMOS transistor 116, and provide a common node that is connected to the gate of the NMOS transistor 112 that serves as the input of the amplifier 102.

FIG. 1C illustrates a circuit diagram that models the example amplifier 102 and adaptive bias circuit 104 of FIG. 1B. In particular, the diode-connected NMOS transistor 114 (Mu1) and the diode-connected NMOS transistor 116 (Md1) have been modeled as respective diodes 124, 126 in FIG. 1C. In addition, to illustrate the charging and discharging of capacitances of the amplifier 102, the NMOS transistor 112 may be modeled as a capacitor/capacitance 112 for the gate-to-source capacitance of NMOS transistor 112. When the RF input signal is small or not applied, the RF input signal cannot turn on or off the diodes 124, 126. Therefore, the DC bias of the input (e.g., input+) may be determined by the reference voltage Vref and the impedance sizes of diodes 124, 126. However, in some instances, the RF input signal may be large enough to turn on and off the diodes 124, 126 for some portion of the RF input signal swing. During time t1, when the RF input signal is positive, current can flow from the capacitance 122 through the diode 126 to ground or another reference voltage in order to discharge the capacitance 122, while diode 124 is turned off. On the other hand, during time t2, when the RF input signal is negative, current flows from the reference voltage Vref through the diode 124 to charge the capacitance 122 while diode 126 is turned off. If the size of the diode 124 (corresponding to the size of NMOS transistor 114) is larger than that of the diode 126 (corresponding to the size of NMOS transistor 116), then the DC level of the input (e.g., input+) may increase as the RF signal level increases because the charging current through diode 124 is larger than the discharging current through diode 126. By selecting the sizes of diode 124 (corresponding to the size of NMOS transistor 114) and diode 126 (corresponding to the size of NMOS transistor 116), the DC level of the input can be controlled in the low power range and can increase the slope of the DC level of the input in high power operation. It will be appreciated that the sizes of the diodes 124, 126 may be associated with current throughput and/or impedance size. Indeed, the size of each diode 124, 126 may be determined by the p-n junction area. For example, if a diode 124, 126 is implemented as a diode-connected MOS transistor, then the size of each diode 124, 126 may be proportional to the width to length ratio (W/L) of the respective MOS transistor.

Figure 1D:
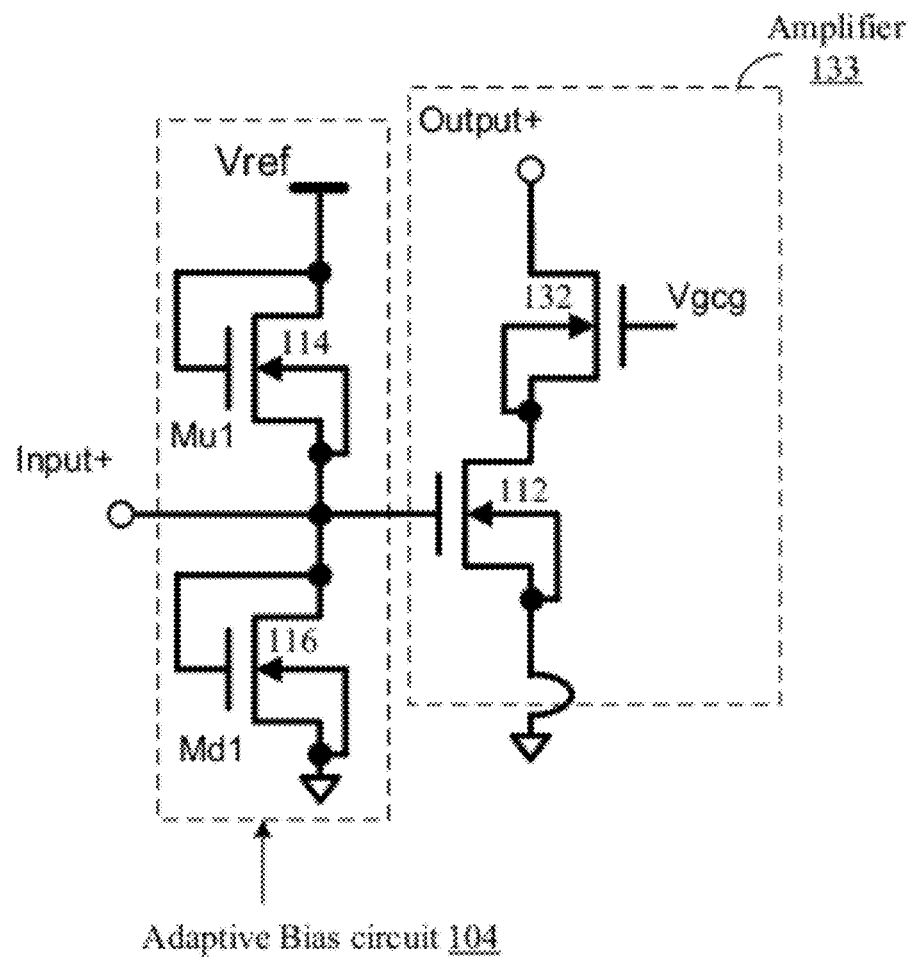
FIG. 1D illustrates an alternative embodiment of an amplifier and adaptive bias circuit, according to an example embodiment of the invention.

FIG. 1D illustrates an alternative embodiment of an amplifier 102 and adaptive bias circuit 104. In particular, the adaptive bias circuit 104 for FIG. 1D is the same as that shown for FIG. 1B. However, the amplifier 133 of FIG. 1D is a variation of the amplifier 102 of FIG. 1B. In particular, the amplifier 133 of FIG. 1D is in an example cascode configuration, where the NMOS transistor 112 is connected to the NMOS transistor 132. The NMOS transistor 112 may have a source connected to a reference voltage such as ground. The gate of the NMOS transistor 112 may be the input that is connected to the adaptive bias circuit 104, and where the RF input signal is received. The drain of the NMOS transistor 112 may be connected to the source of the NMOS transistor 132. The drain of the NMOS transistor 132 may provide the output (e.g., output+) of the amplifier 133. The gate of the NMOS transistor 132 may be provided with a gate bias voltage Vgcg. It will be appreciated that the bias voltage (Vgcg) may be set to a desired optimum voltage. In particular, the value of bias voltage (Vgcg) may determine a drain bias for NMOS transistor 112. Therefore, it can control the current level of the drain current of the transistor 112, because there is a channel length modulation effect. However, controlling the bias voltage (Vgcg) level may be used to adjust the linearity and efficiency for the power amplifier (PA).

Figure 2:
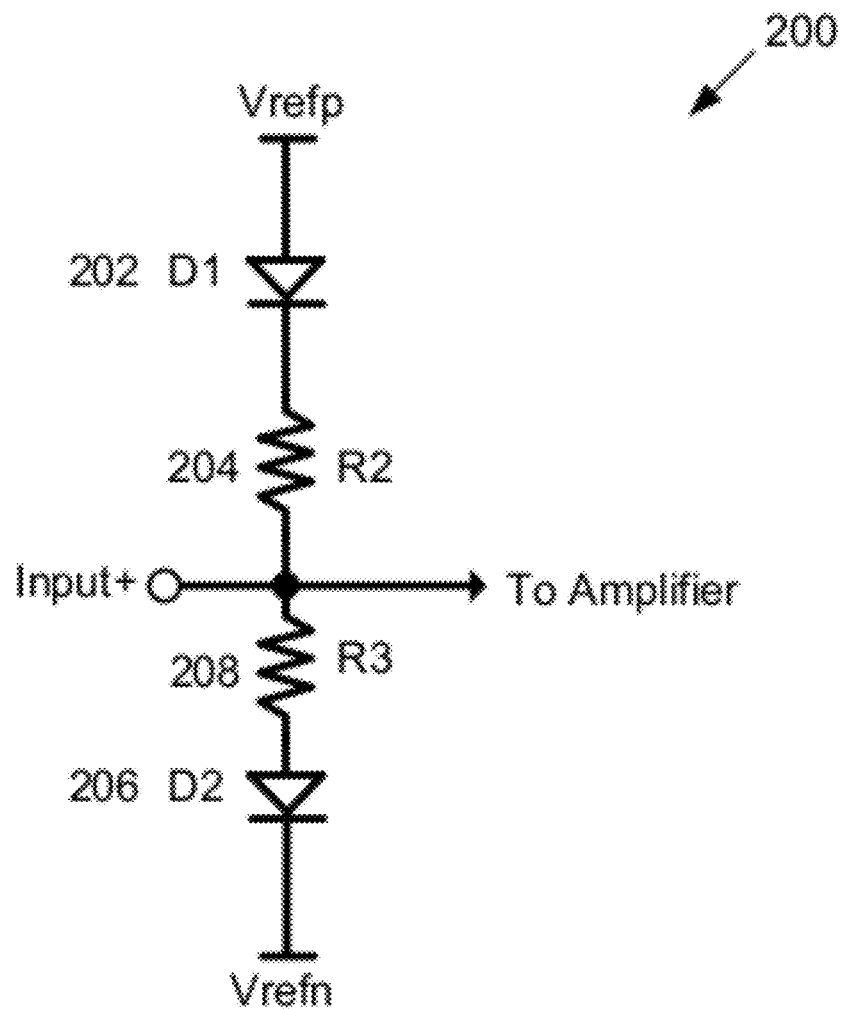
FIG. 2 illustrates a configuration of an example bias circuit in accordance with an example embodiment of the invention.

FIG. 2 illustrates a configuration of an example bias circuit 200 in accordance with an example embodiment of the invention. The example bias circuit 200 can be utilized for implementing the example adaptive bias circuit 104 discussed with respect to FIGS. 1A, 1B, and 1D. As shown in FIG. 2, there is a series configuration of a first diode 202 (D1), a first resistor 204 (R2), a second resistor 208 (R3), and a second diode 206 (D2) connected between a first reference voltage (Vrefp) and a second reference voltage (Vrefn), which may include a ground (GND) reference. The first reference voltage (Vrefp) may be at a higher voltage than the second reference voltage (Vrefn). The first diode 202 (D1) and first resistor 204 (R2) may be part of a charging circuit, while the second resistor 208 (R3) and the second diode 206 (D2) may be part of a discharging circuit.

Still referring to FIG. 2, the positive terminal (anode) of the first diode 202 may be connected to the first reference voltage (Vrefp), and the negative terminal (cathode) of the first diode 202 may be connected to a first end of the first resistor 204. A second end of the first resistor 204 may be connected to a first end of the second resistor 208. A second end of the second resistor 208 may be connected to the positive terminal of the second diode 206, and the negative terminal of the second diode 206 may be connected to the second reference voltage (Vreth).

In FIG. 2, a node between the first and second resistors 204, 208 is connected to the input terminal (Input+ or Input−) of an amplifier (e.g., a gate or base of a respective MOS transistor or BJT). The resistances selected for resistors 204, 208 can be adjusted to provide the desired impedances in the respective charging or discharging circuits. It will also be appreciated that the input terminal could be connected to a node between the first diode 202 and the first resistor 204, a node between the second resistor 208 and the second diode 206, or any other node that exists between the first diode 202 and the second diode 206, without departing from example embodiments. According to an example embodiment, the location or order of the diodes and the resistors in the respective charging and discharging circuit may be changed or modified in accordance with different applications. In addition, one or both of resistors 204 or 208 may be optional and omitted without departing from example embodiments of the invention.

It will be appreciated that the example bias circuit 200 of FIG. 2 that the rate of increase of the DC level to the RF input power level can be achieved by increasing the size of the first diode 202 (D1). In other words, if the size of the diode 202 (D1) in the charging circuit is increased, the charging current proportional to the RF input level should be increased. Therefore, the DC level of the input or gate of the amplifier can increase more rapidly. To increase the DC level at the small signal level, the resistance 208 (R3) may be increased, according to an example embodiment of the invention.

Figure 3:
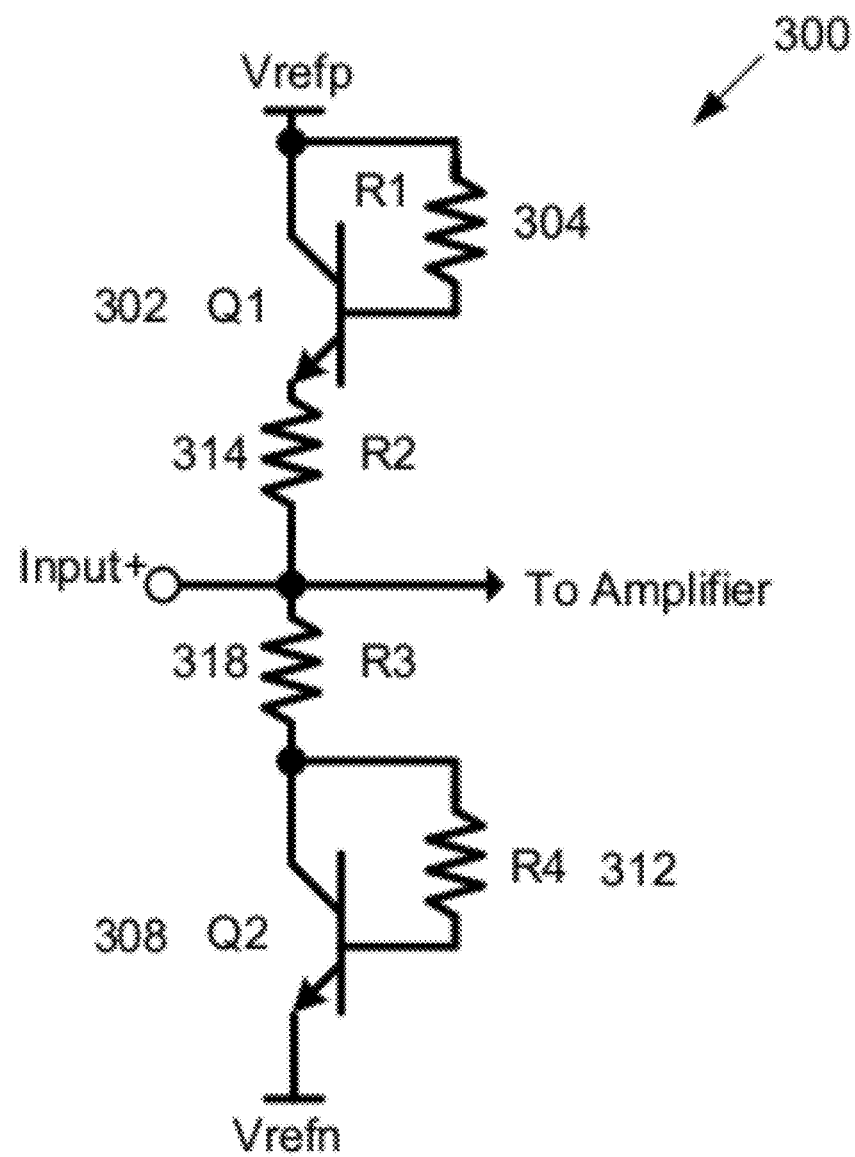
FIGS. 3-6 provide variations of example bias circuits in accordance with an example embodiment of the invention.

FIGS. 3-6 provide variations of example bias circuits in accordance with an example embodiment of the invention. FIG. 3 illustrates an example bias circuit 300 that includes at least two diode-connected BJTs, according to an example embodiment of the invention. A first diode-connected BJT may comprise a BJT 302 (Q1) in which its base is connected to its collector, either directly or via a resistor 304 (R1). The collector of the BJT 302 may be connected to a first reference voltage (Vrefp), and the emitter of the BJT 302 may be connected to the resistor 314 (R2). The BJT 302 and the resistor 314 may form an example charging circuit. Likewise, in FIG. 3, the second diode-connected BJT may comprise a BJT 308 (Q2) in which its base is connected to its collector, either directly or via a resistor 312 (R4). The collector of the BJT 308 may be connected to the resistor 318 (R3), and the emitter of the BJT 308 may be connected to the second reference voltage (Vrefn). The BJT 308 and the resistor 318 may form an example discharging circuit. The resistances selected for resistors 314, 318 and the sizes of BJTs 302, 308 can be adjusted to provide the desired impedances in the respective charging or discharging circuits. It will also be appreciated that the input terminal (Input+ or Input−) could be connected to a node between the first BJT 302 and the first resistor 314, a node between the second resistor 318 and the second BJT 308, or any other node that exists between the first BJT 302 and the second BJT 308, without departing from example embodiments. In addition, one or both of resistors 314 or 318 may be optional and omitted without departing from example embodiments of the invention.

Figure 4:
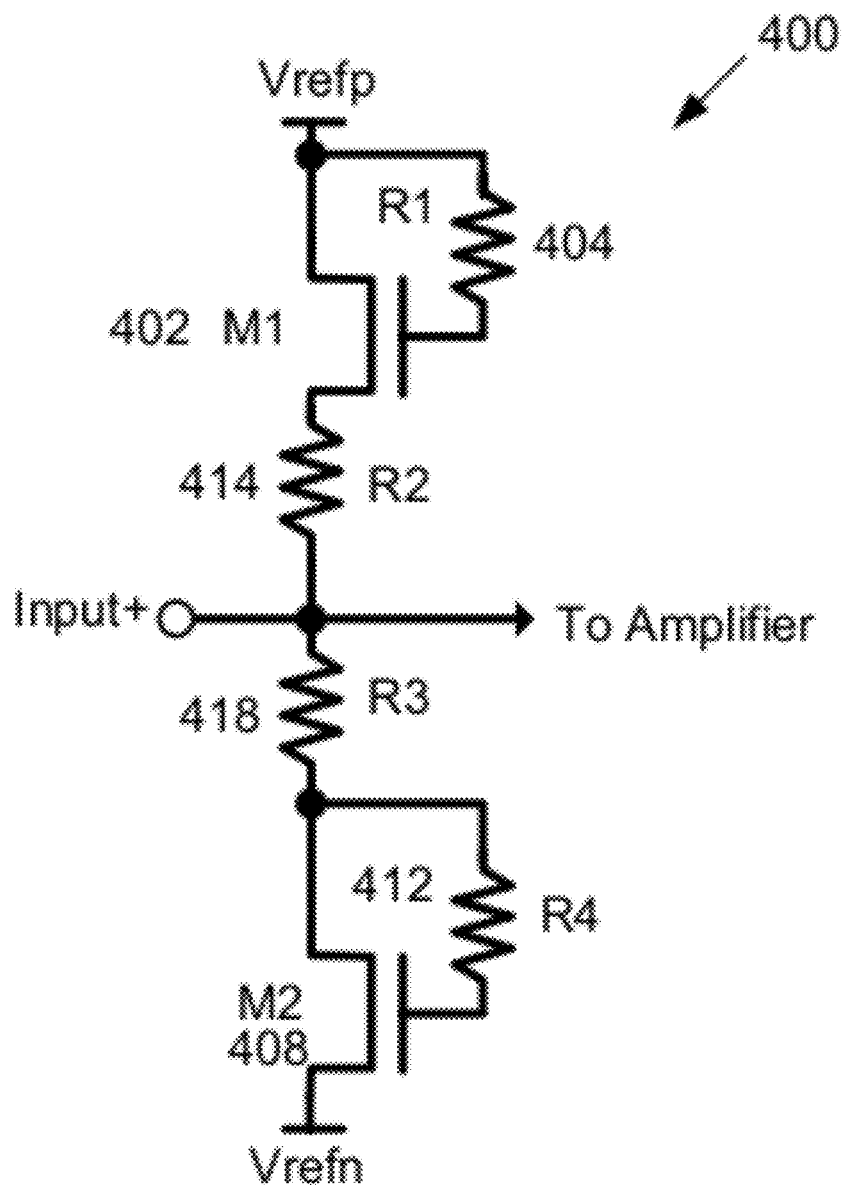

FIG. 4 illustrates an example bias circuit 400 that includes two diode-connected NMOS transistors. A first diode-connected NMOS transistor may comprise an NMOS transistor 402 (M1) in which its gate may be connected to its drain, either directly or via a resistor 404 (R1). The drain of the NMOS transistor 402 may be connected to the first reference voltage (Vrefp), and the source of the NMOS transistor 402 may be connected to the resistor 414 (R2). The NMOS transistor 402 and resistor 414 may form a part of a charging circuit. Likewise, a second diode-connected NMOS transistor may comprise an NMOS transistor 408 (M2) in which its gate may be connected to its drain, either directly or via a resistor 412 (R4). The drain of the NMOS transistor 408 may be connected to the resistor 418 (R3), and the source of the NMOS transistor 408 may be connected to the second reference voltage (Vrefn). The NMOS transistor 408 and the resistor 418 may form part of a discharging circuit. The resistances selected for resistors 414, 418 and sizes of transistors 402, 408 can be adjusted to provide the desired impedances in the respective charging or discharging circuits. It will also be appreciated that the input terminal (Input+ or Input−) could be connected to a node between the first NMOS transistor 402 and the first resistor 414, a node between the second resistor 418 and the second NMOS transistor 408, or any other node that exists between the first NMOS transistor 402 and the second NMOS transistor 408, without departing from example embodiments. In addition, one or both of resistors 414 or 418 may be optional and omitted without departing from example embodiments of the invention.

Figure 5:
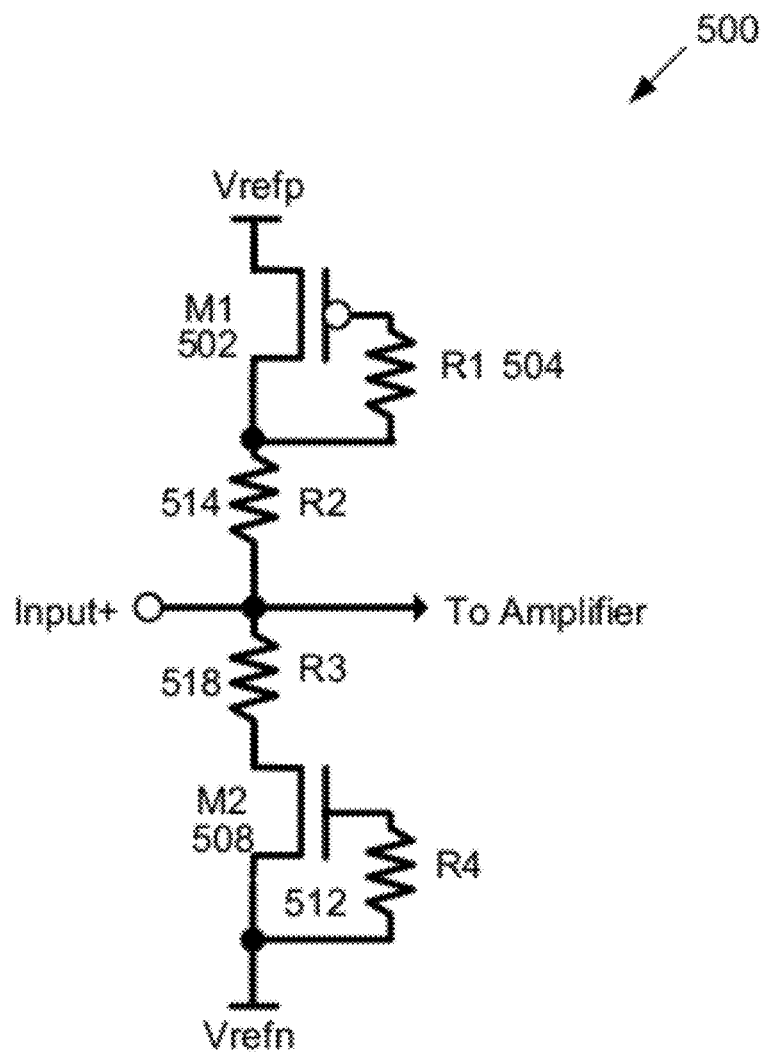

FIG. 5 illustrates an example bias circuit 500 that includes a diode-connected PMOS transistor and a diode-connected NMOS transistor. In particular, in FIG. 5, a first diode-connected PMOS transistor may comprise a PMOS transistor 502 (M1) in which its gate may be connected to its drain, either directly or via a resistor 504 (R1). The source of the PMOS transistor 502 may be connected to the first reference voltage (Vrefp), and the drain of the PMOS transistor 502 may be connected to the resistor 514 (R2). The PMOS transistor 502 and the resistor 514 may form part of a charging circuit. Likewise, in FIG. 5, a second diode-connected NMOS transistor may comprise an NMOS transistor 508 (M2) in which its gate may be connected to its source, either directly or via a resistor 512 (R4). The drain of the NMOS transistor 508 may be connected to the resistor 518 (R3), and the source of the NMOS transistor 508 may be connected to the second reference voltage (Vrefn). The NMOS transistor 508 and the resistor 518 may form part of a discharging circuit. The resistances selected for resistors 514, 518 and sizes of transistors 502, 508 can be adjusted to provide the desired impedances in the respective charging or discharging circuits, according to an example embodiment of the invention. It will also be appreciated that the input terminal (Input+ or Input−) could be connected to a node between the first PMOS transistor 502 and the first resistor 514, a node between the second resistor 518 and the second NMOS transistor 508, or any other node that exists between the first NMOS transistor 502 and the second NMOS transistor 508, without departing from example embodiments. In addition, one or both of resistors 514 or 518 may be optional and omitted without departing from example embodiments of the invention.

Figure 6:
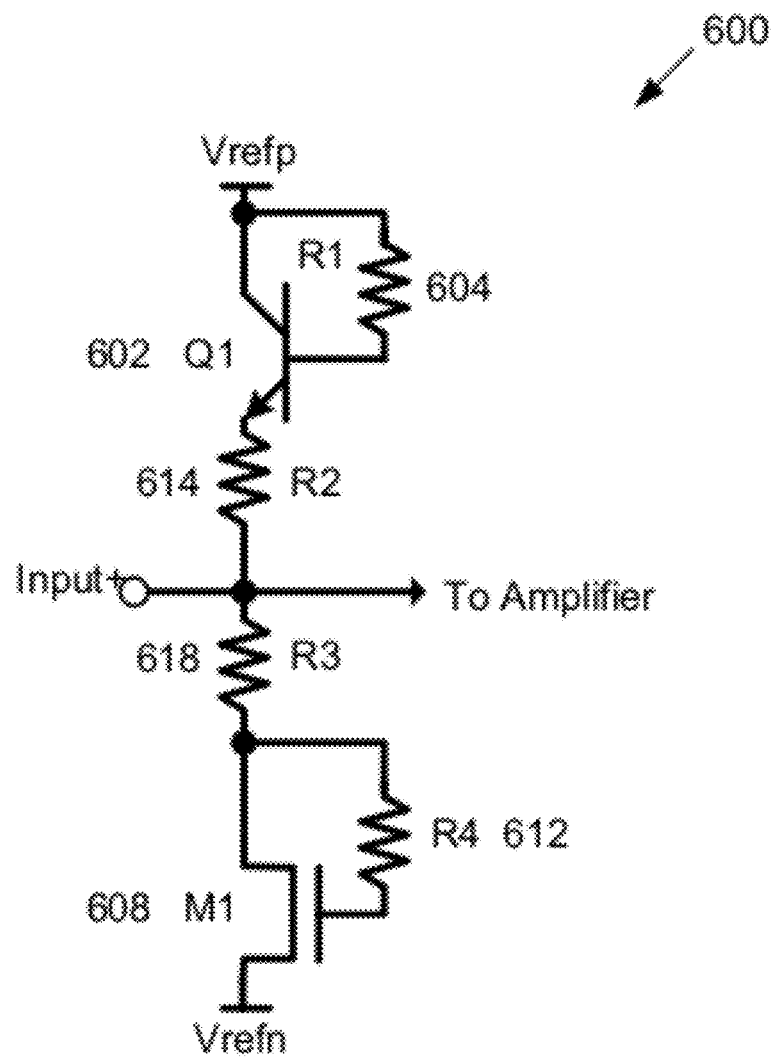

FIG. 6 illustrates an example bias circuit 600 that includes a diode-connected BJT and a diode-connected NMOS transistor. In particular, in FIG. 6, a first diode-connected BJT may comprise a BJT 602 (Q1) in which its base may be connected to its collector via a resistor 604 (R1). The collector of the BJT 602 may be connected to first reference voltage (Vrefp), and the emitter of the BJT 602 is connected to the resistor 614 (R2). The BJT 602 and the resistor 614 may form part of a charging circuit. Likewise, a second diode-connected NMOS transistor may comprise an NMOS transistor 608 (M1) in which its gate may be connected to its drain via a resistor 612 (R4). The drain of the NMOS transistor 608 may be connected to the resistor 618 (R3), and the source of the NMOS transistor 608 is connected to the second reference voltage (Vrefn). The NMOS transistor 608 and the resistor 618 may form part of a discharging circuit. The resistances selected for resistors 614, 618 and sizes of BJT 602 and NMOS transistor 608 can be adjusted to provide the desired impedances in the respective charging or discharging circuits. It will also be appreciated that the input terminal (Input+ or Input−) could be connected to a node between the first BJT 602 and the first resistor 614, a node between the second resistor 618 and the second NMOS transistor 608, or any other node that exists between the first BJT 602 and the second NMOS transistor 608, without departing from example embodiments. In addition, one or both of resistors 614 or 618 may be optional and omitted without departing from example embodiments of the invention.

Figure 7:
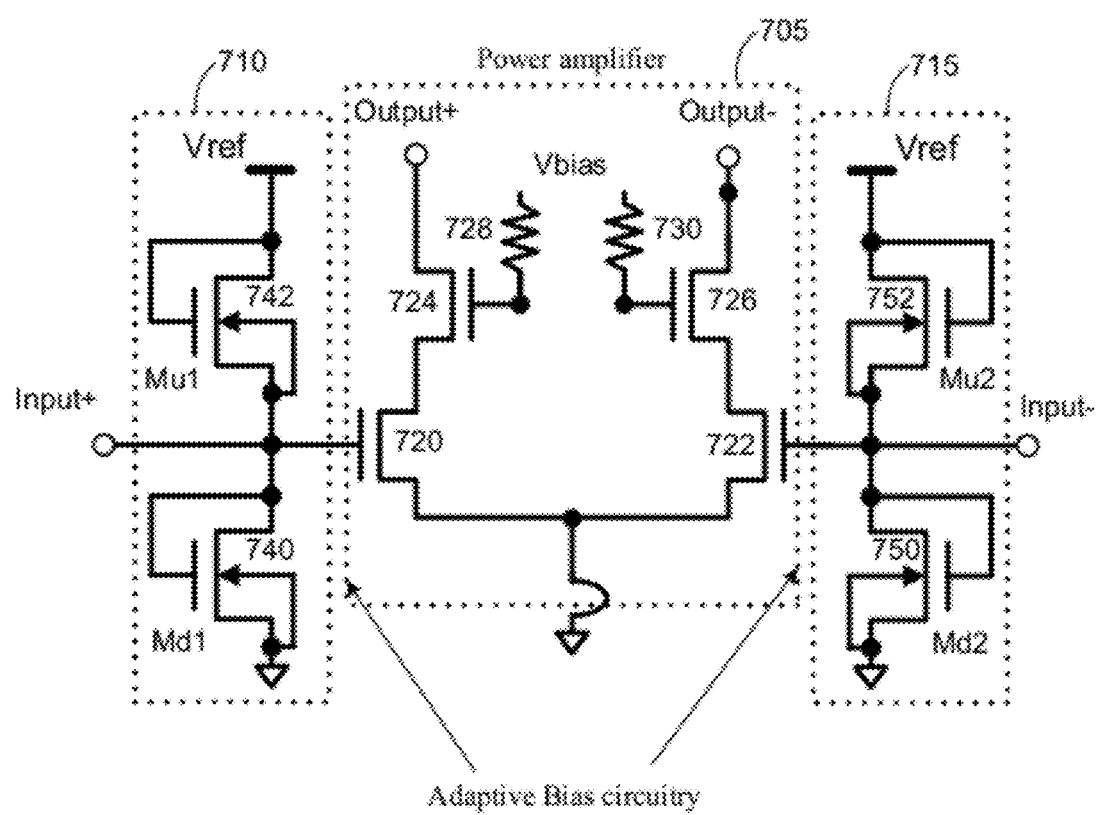
FIG. 7 illustrates an example CMOS power amplifier system having a differential topology and adaptive bias circuits, according to an example embodiment of the invention.

FIG. 7 illustrates an example CMOS power amplifier system 700 having a differential topology and adaptive bias circuits, according to an example embodiment of the invention. More specifically, the power amplifier system 700 may include a power amplifier 705, and respective adaptive bias circuits 710, 715 for the power amplifier 705.

The power amplifier 705 may be a differential power amplifier comprising a first cascode stage and a second cascode stage. The first cascode stage may include a common-source device (e.g., common-source transistor) 720 and a common-gate device (e.g., common-gate transistor) 724. Likewise, the second cascode stage may include a common-source device 722 and a common-gate device 726. It will be appreciated that the first and second cascode stages may be in a cascode configuration, according to an example embodiment of the invention. However, other variations of the differential power amplifier 705 are available without departing from example embodiments of the invention.

In an example embodiment of the invention, devices 720, 722, 724, and 726 may comprise respective MOSFETs, including n-channel MOSFETs, having respective gate, source, and drain terminals. The respective gates of common-gate devices 724, 726 may be biased via respective biasing resistors 728, 730 using a gate bias source $V_b$. Likewise, the drains of the respective devices 724, 726 may serve as, or are connected to, respective output ports for providing respective positive and negative output signals of the power amplifier 705. The sources of respective devices 720, 722 may be connected together by a common ground (GND).

The differential system inputs (e.g., Input+ and Input−) may be received at the respective gates of common-gate devices 720 and 722. More specifically, the gate of the common-gate device 720 may serve as, or is connected to, a positive input port for receiving a positive system input signal while the gate of the common-gate device 722 may serve as, or is connected to, a negative input port for receiving a negative system input signal.

In an example embodiment of the invention, a first bias circuit 710 may be connected to the positive input port at the gate of common-gate device 720, while a second bias circuit 715 may be connected to the negative input port at the gate of the common-gate device 722. In general, the respective first bias circuit 710 and second bias circuit 715 may operate to boost up the DC bias voltage applied to the respective input (e.g., gates) of the common-gate devices 720, 722 as the RF input signal level increases. By boosting the DC bias voltage with large RF input signals, the output power of the power amplifier 705 at the output ports may likewise be increased to peak power, for example, at $P_{1dB}$ (output power at 1 dB compression) or another compression point, according to an example embodiment of the invention. The use of the respective first and second bias circuits 710, 715 may minimize amplitude-to-amplitude (AM-AM) nonlinearity and power back-off from the peak (e.g., at $P_{1dB}$), thereby increasing the average output power ($P_{out}$) and the efficiency, according to an example embodiment of the invention.

Still referring to FIG. 7, there is illustrated an example implementation for the first bias circuit 710 and the second bias circuit 715. It will be appreciated that the example implementation in FIG. 7 is by way of example only, and that other variations may be available without departing from example embodiments of the invention. Examples of such variations of the first and second bias circuits 710, 715 have been discussed herein with respect to FIGS. 1-6. Many other variations of the first and second bias circuits 710, 715 are available without departing from example embodiments of the invention.

In FIG. 7, the first bias circuit 710 may be comprised of a series connection of an NMOS transistor 742 (Mu1) and an NMOS transistor 740 (Md1). For example, the source of NMOS transistor 742 may be connected to the drain of NMOS transistor 740. A first reference voltage (Vref) may be provided at the drain of NMOS transistor 742, and a second reference voltage (e.g., ground (GND)) may be provided at the source of the NMOS transistor 740. The NMOS transistor 742 (Mu1) may be configured as a diode-connected transistor by connecting its gate to its drain, either directly or via a resistor, according to an example embodiment of the invention. The NMOS transistor 740 may be configured as a diode-connected transistor by connecting its gate to its drain (with or without the use of a resistor), according to an example embodiment of the invention. The NMOS transistor 742 may be part of a charging circuit while the NMOS transistor 740 may be part of a discharging circuit, according to an example embodiment of the invention.

Similarly, the second bias circuit 715 may be comprised of an NMOS transistor 752 (Mu2), and an NMOS transistor 750 (Md2) connected in series. For example, the source of NMOS transistor 752 may be connected to the drain of the NMOS transistor 750. A first reference voltage (Vref) may be provided at the drain of the NMOS transistor 752, and a second reference voltage (e.g., ground (GND)) may be provided at the source of the NMOS transistor 750. The NMOS transistor 752 (Mu2) may be configured as a diode-connected transistor by connecting its gate to its drain, either directly or via a resistor, according to an example embodiment of the invention. The NMOS transistor 750 may be configured as a diode-connected transistor by connecting its gate to its drain (with or without the use of a resistor), according to an example embodiment of the invention. The NMOS transistor 752 may be part of a charging circuit while the NMOS transistor 750 may be part of a discharging circuit, according to an example embodiment of the invention.

For the first bias circuit 710, a node between the source of the NMOS transistor 742 (Mu1) and the drain of NMOS transistor 740 (Md1) may be connected to the gate of the common-gate device 720 of the power amplifier 705. Similarly, for the second bias circuit 715, a node between the source of the NMOS transistor 752 and the drain of the NMOS transistor 750 may be connected to the gate of the common-gate device 722 of the power amplifier 705. The respective bias circuits 710, 715 provide respective gate bias voltages, which may remain constant with low radio frequency (RF) input (Input+ or Input−) power, according to an example embodiment of the invention. As the RF input power level increases, the respective bias circuits 710, 715 can adaptively increase the respective gate DC bias voltages based upon the respective higher RF input power levels.

The adaptive biasing operation of the respective bias circuits 710, 715 will now be described in further detail. More specifically, as the RF input power level of an input signal (Input+ or Input−) increases, the respective diode-connected NMOS transistors 742, 752 may turn off for at least a portion of the upper half cycle of the respective RF input signal and may get forward biased (e.g., turned on) for the opposite lower half cycle. When the diode-connected NMOS transistors 742, 752 are turned on for at least a portion of the lower half cycle of the respective RF input signal, a charge current may be allowed to flow from the reference voltage Vref to charge one or more capacitances (e.g., gate-to-source capacitances) associated with the respective transistors 720, 722. On the other hand, the respective NMOS transistors 740, 750 may turn on for at least a portion of the upper half cycle of the respective input signal and may be turned off for the opposite lower half cycle. When the NMOS transistors 740, 750 are turned on during the upper half cycle, discharge current may be allowed to flow from one or more capacitances (e.g., gate-to-source capacitances) associated with the respective transistor 720, 722 to ground or another reference voltage. As a result, the rectified DC voltage at the respective gates (of respective common-gate devices 720, 722) of the power amplifier 705 may increase adaptively based upon an increase in the input power (Input+ or Input−) level, according to an example embodiment of the invention.

It will be appreciated that while n-channel MOS transistors have been illustrated above, p-channel MOS transistors can also be utilized as well. Furthermore, instead of a MOS transistor, a bipolar junction transistor (BJT) or other heterojunction bipolar transistor can be utilized as well. For example, if a BJT were used instead of a MOS transistor, then the emitter, base, and collector of the BJT can correspond to the source, gate, and drain of the MOS transistor.

Figure 8:
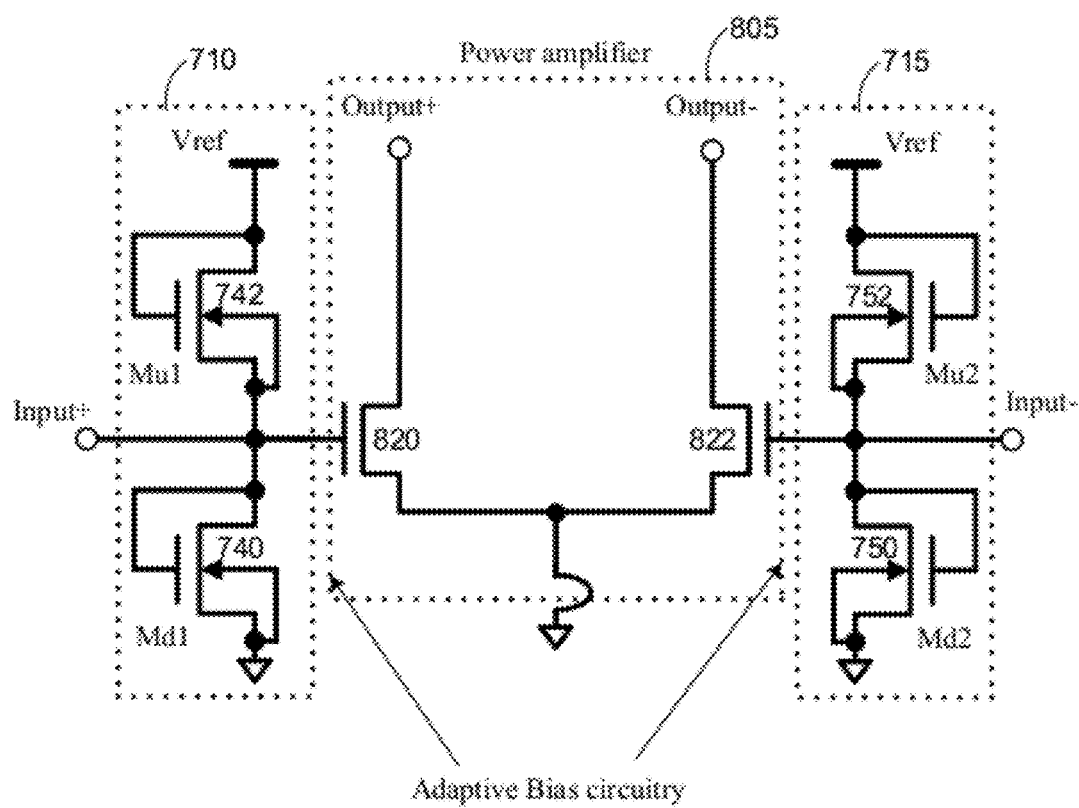
FIG. 8 illustrates a variation of the CMOS power amplifier system of FIG. 7, according to an example embodiment of the invention.

FIG. 8 illustrates a variation of the CMOS power amplifier system of FIG. 7. In particular, in FIG. 8, the power amplifier 805 may be a differential amplifier including common-source devices 820, 822. The common-source devices may be MOSFETs, as described previously. However, in the power amplifier 805, the respective outputs of the power amplifier 805 may be obtained from the respective drains of the common-source devices.

Figure 9:
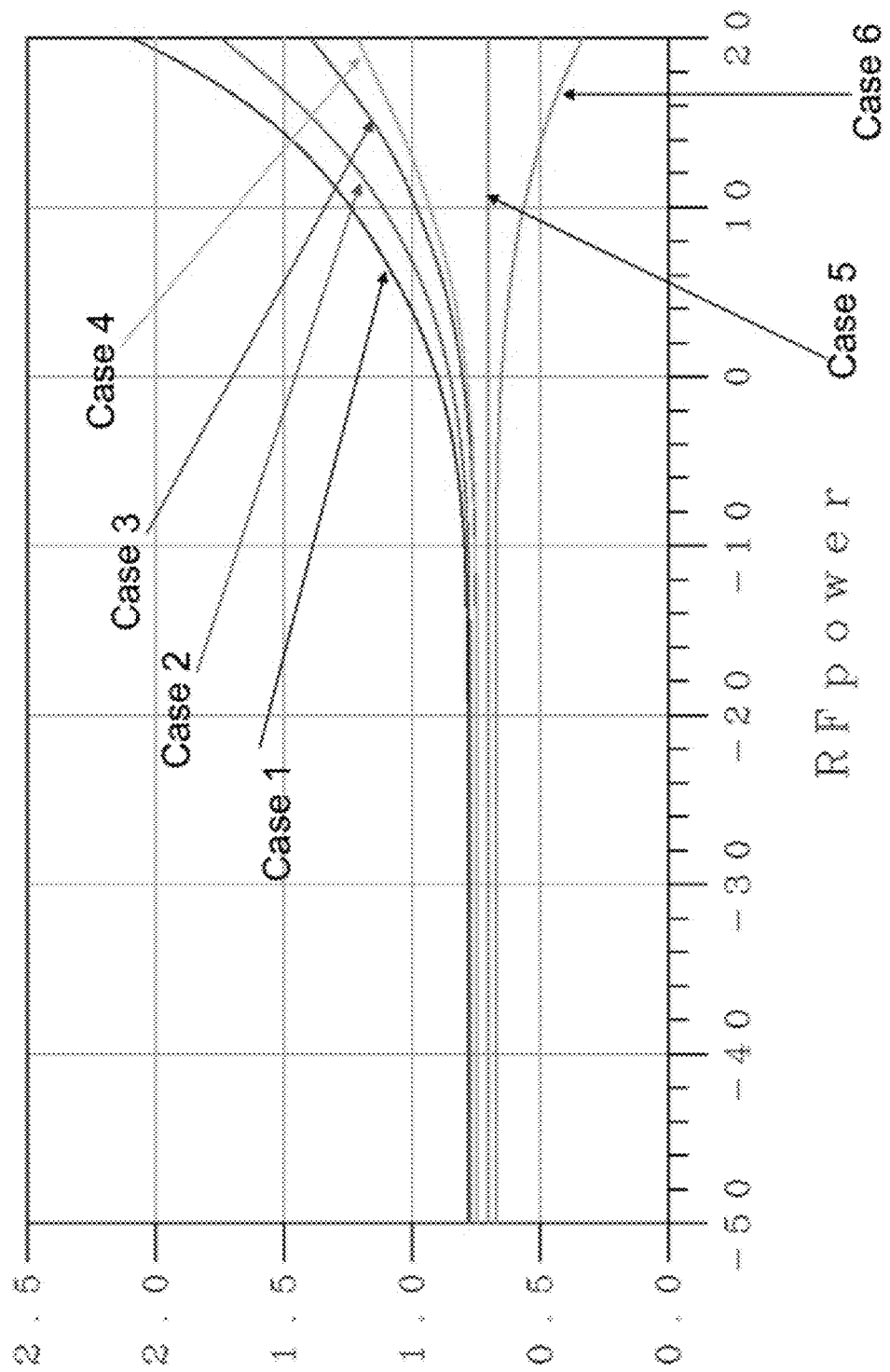
FIG. 9 illustrates some example results of an example software simulation, according to an example embodiment of the invention.

FIG. 9 illustrates some example results of an example software simulation, according to an example embodiment of the invention. The example simulation of FIG. 9 may be conducted in accordance with the example circuit of FIG. 4. Unless otherwise stated herein, the first reference voltage (Vrefp) may be 1.4V; the second reference voltage (Vrefn) may be 0V; resistors R1, R2, R3, and R4 may all be 0 ohm; the width to length ratio (W/L) of transistor M1 may be 32 µm/0.18 µm; the W/L of transistor M2 may be 16 µm/0.18 µm, and the model may be based on a 0.18 µm CMOS technology, according to an example embodiment of the invention. The RF power levels are from −50 dBm to 20 dBm. In FIG. 9, the x axis is RF input power, and the y axis is the DC level of the node to the amplifier. As shown, Case 1 is with resistor R3 has been changed from 0 ohm to 100 ohm. In Case 2, the W/L of transistor M1 has been changed from 32 µm/0.18 µm to 64 µm/0.18 µm. In Case 3, the values are set as initially described above. In Case 4, resistor R4 has been changed from 0 ohm to 1000 ohm. In Case 5, the W/L of M1 has been changed from 32 µm/0.18 µm to 16 µm/0.18 µm. In Case 6, the W/L of transistor M2 has been changed from 16 µm/0.18 µm to 64 µm/0.18 µm. It should be noted that if the sizes of transistors M1 and M2 are the same, the DC level of the gate may be not change regardless of the input power level, as shown in Case 5 of the FIG. 9, as the impedances of the charging and discharging circuits are the same for the entire power range. Case 6 shows that if the size of the transistor M2 diode is larger than that of the transistor M1 diode, the DC level decreases as the input power level even increases. It will be appreciated that if the resistance of R1 is increased, the slope of the DC level at the large signal range may be decreased without any change of the DC level at the small signal range (comparing Case 4 with Case 3). As Case 2 compared with Case 3, it will also be appreciated that if the size of the diode-connected transistor M1 is increased, the DC levels at the small signal level and the slope of the dc level at the large signal level are simultaneously increased. As shown in Case 1 and Case 3, if a impedance independent of input signal level is added in the discharging circuit, in other words, if R3 is added (Case 1), the DC levels at the small signal level and the slope of the DC level at the large signal level may be simultaneously increased, according to an example embodiment of the invention.

While the example embodiments have applied one or more adaptive bias circuits to an input of an amplifier, it will be appreciated that the example adaptive bias circuits can also be utilized with a variety of inputs for many other active devices, including but not limited to, NMOS transistors, PMOS transistors, Varactors, pnp BJTs, npn BJTs, HBTs, JFETs, metal-insulator-semiconductor field-effect transistors (MISFETs), HEMTs, laterally diffused metal oxide semiconductor (LDMOS) transistors, insulated-gate bipolar transistors (IGBTs), etc.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. An amplifier system, comprising:
   an amplifier having at least a first input port, wherein the amplifier includes a first capacitance associated with the first input port;
   a first bias circuit, wherein the first bias circuit comprises a series connection of a first charging circuit and a first discharging circuit, wherein a first node between the first charging circuit and the first discharging circuit is connected to the first input port of the amplifier,
   wherein responsive to a radio frequency (RF) input signal having at least a first predetermined level being received at the first input port, the first charging circuit charges the first capacitance associated with the first input port during a first portion of a cycle of the RF input signal, and discharges the first capacitance associated with the first input port during a second portion of the cycle of the RF input signal, thereby controlling a DC bias voltage level available at the first input port of the amplifier.

2. The amplifier system of claim 1, wherein the first charging circuit is connected to a first reference voltage, and the second charging circuit is connected to a second reference voltage, wherein the first charging circuit charges the first capacitance by allowing a charge current to flow from the first reference voltage to the first input port, and wherein the first discharging circuit discharges the first capacitance by allowing a discharge current to flow from the first capacitance to the second reference voltage.

3. The amplifier system of claim 1, wherein the second reference voltage is ground (GND).

4. The amplifier system of claim 1, wherein the first portion of the cycle of the RF input signal is a lower half cycle of the RF input signal, and wherein the second portion of the cycle is the upper half cycle of the RF input signal.

5. The amplifier system of claim 1, wherein when the RF input signal is less than a second predetermined level, the first charging circuit substantially prevents charge current from flowing to the first input port, and the first discharging circuit substantially prevents discharge current from flowing from the first input port, thereby maintaining a substantially constant DC bias voltage.

6. The amplifier system of claim 1, wherein when the RF input signal is at a second level below the first predetermined level, the DC bias voltage is boosted based upon the first charging circuit charging the first capacitance to a greater extent than the first discharging circuit discharging the first capacitance.

7. The amplifier system of claim 1, wherein each of the first charging circuit and the first discharging circuit comprises either (i) a diode, or (ii) a diode-connected transistor.

8. The amplifier system of claim 7, wherein at least one of the first charging circuit and the second discharging circuit includes a respective resistor in series with either the (i) the diode, or (ii) the diode-connected transistor.

9. The amplifier system of claim 1, wherein the amplifier is a differential amplifier further having a second input port and a second capacitance associated with the second input port, and further comprising:
  a second bias circuit, wherein the second bias circuit comprises a series connection of a second charging circuit and a second discharging circuit, wherein a second node between the second charging circuit and the second discharging circuit is connected to the second input port of the amplifier,
  wherein responsive to a second RF input signal having at least the first predetermined level being received at the second input port, the second charging circuit charges the second capacitance associated with the second input port during a first portion of a cycle of the second RF input signal, and discharges the second capacitance associated with the second input port during a second portion of the cycle of the RF input signal, thereby controlling a DC bias voltage level available at the second input port of the amplifier.

10. The amplifier system of claim 1, wherein the first capacitance is a gate-to-source capacitance or base-to-emitter capacitance associated with the amplifier.

11. A method, comprising:
  providing an amplifier having at least a first input port, wherein the amplifier includes a first capacitance associated with the first input port;
  providing a first bias circuit, wherein the first bias circuit comprises a series connection of a first charging circuit and a first discharging circuit, wherein a first node between the first charging circuit and the first discharging circuit is connected to the first input port of the amplifier; and
  responsive to a radio frequency (RF) input signal having at least a first predetermined level being received at the first input port:
    charging, by the first charging circuit, the first capacitance associated with the first input port during a first portion of a cycle of the RF input signal, and
    discharging, by the first discharging circuit, the first capacitance associated with the first input port during a second portion of the cycle of the RF input signal, thereby controlling a DC bias voltage level available at the first input port of the amplifier.

12. The method of claim 11, wherein the first charging circuit is connected to a first reference voltage, and the second charging circuit is connected to a second reference voltage, wherein the first charging circuit charges the first capacitance by allowing a charge current to flow from the first reference voltage to the first input port, and wherein the first discharging circuit discharges the first capacitance by allowing a discharge current to flow from the first capacitance to the second reference voltage.

13. The method of claim 11, wherein the second reference voltage is ground (GND).

14. The method of claim 11, wherein the first portion of the cycle of the RF input signal is a lower half cycle of the RF input signal, and wherein the second portion of the cycle is the upper half cycle of the RF input signal.

15. The method of claim 11, wherein when the RF input signal is less than a second predetermined level, the first charging circuit substantially prevents charge current from flowing to the first input port, and the first discharging circuit substantially prevents discharge current from flowing from the first input port, thereby maintaining a substantially constant DC bias voltage.

16. The method of claim 11, wherein when the RF input signal is at a second level below the first predetermined level, the DC bias voltage is boosted based upon the first charging circuit charging the first capacitance to a greater extent than the first discharging circuit discharging the first capacitance.

17. The method of claim 11, wherein each of the first charging circuit and the first discharging circuit comprises either (i) a diode, or (ii) a diode-connected transistor.

18. The method of claim 17, wherein at least one of the first charging circuit and the second discharging circuit includes a respective resistor in series with either the (i) the diode, or (ii) the diode-connected transistor.

19. The method of claim 11, wherein the amplifier is a differential amplifier further having a second input port and a second capacitance associated with the second input port, and further comprising:
  providing a second bias circuit, wherein the second bias circuit comprises a series connection of a second charging circuit and a second discharging circuit, wherein a second node between the second charging circuit and the second discharging circuit is connected to the second input port of the amplifier,
  wherein responsive to a second RF input signal having at least the first predetermined level being received at the second input port, the second charging circuit charges the second capacitance associated with the second input port during a first portion of a cycle of the second RF input signal, and discharges the second capacitance associated with the second input port during a second portion of the cycle of the RF input signal, thereby controlling a DC bias voltage level available at the second input port of the amplifier.

20. The method of claim 11, wherein the first capacitance is a gate-to-source capacitance or base-to-emitter capacitance associated with the amplifier.

* * * * *